US009497859B2

(12) United States Patent
Hojo et al.

(10) Patent No.: US 9,497,859 B2
(45) Date of Patent: Nov. 15, 2016

(54) METAL MICROPARTICLE DISPERSION, PROCESS FOR PRODUCTION OF ELECTRICALLY CONDUCTIVE SUBSTRATE, AND ELECTRICALLY CONDUCTIVE SUBSTRATE

(75) Inventors: Mikiko Hojo, Tokyo (JP); Shinya Yoneda, Fukushima (JP); Naonobu Yoshi, Ibaraki (JP); Takeshi Sato, Kanagawa (JP); Kisei Matsumoto, Kanagawa (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 576 days.

(21) Appl. No.: 13/497,555

(22) PCT Filed: Sep. 6, 2010

(86) PCT No.: PCT/JP2010/065265
§ 371 (c)(1),
(2), (4) Date: Mar. 22, 2012

(87) PCT Pub. No.: WO2011/040189
PCT Pub. Date: Apr. 7, 2011

(65) Prior Publication Data
US 2012/0267151 A1 Oct. 25, 2012

(30) Foreign Application Priority Data
Sep. 30, 2009 (JP) .................................. 2009-229073

(51) Int. Cl.
*H01B 1/02* (2006.01)
*H01B 1/04* (2006.01)
(Continued)

(52) U.S. Cl.
CPC ............. *H05K 1/097* (2013.01); *B22F 1/0022* (2013.01); *B22F 1/0074* (2013.01); *B22F 3/1055* (2013.01); *B82Y 30/00* (2013.01); *B22F 2003/1054* (2013.01); *Y02P 10/295* (2015.11)

(58) Field of Classification Search
None
See application file for complete search history.

(56) References Cited

U.S. PATENT DOCUMENTS

| 6,005,023 A * | 12/1999 | Anton | .................... C09D 11/30 106/31.13 |
| 6,441,066 B1 * | 8/2002 | Woodworth | ......... C08K 5/0041 524/495 |

(Continued)

FOREIGN PATENT DOCUMENTS

| JP | 2002-324966 | 11/2002 |
| JP | 2004-253794 | 9/2004 |

(Continued)

OTHER PUBLICATIONS

English text machine translation of Maruyama et al. (JP 2006-009120 A, an IDS ref), attached to the case file as a PDF and accessed on the JPO AIPN website on Sep. 22, 2014.*

(Continued)

*Primary Examiner* — Harold Pyon
*Assistant Examiner* — Katie L Hammer
(74) *Attorney, Agent, or Firm* — Ladas & Parry LLP

(57) ABSTRACT

Provided is a metal microparticle dispersion including metal microparticles, a polymeric dispersant and a dispersion medium, wherein an average primary particle diameter of the metal microparticles is 0.001 to 0.5 µm; the polymeric dispersant has a polyester skeleton in at least one of a principal chain and a side chain thereof; or the polymeric dispersant has a polyether skeleton in at least one of a principal chain and a side chain thereof; and a content of the above polymeric dispersant is 0.1 to 100 parts by mass based on a content of 100 parts by mass of the metal microparticles. Further, provided is a production process for an electrically conductive substrate, and an electrically conductive substrate produced by the above production process is provided.

12 Claims, 1 Drawing Sheet

(51) Int. Cl.
*H05K 1/09* (2006.01)
*H05K 3/12* (2006.01)
*B22F 1/00* (2006.01)
*B22F 3/105* (2006.01)
*B82Y 30/00* (2011.01)

(56) References Cited

U.S. PATENT DOCUMENTS

| | | | |
|---|---|---|---|
| 6,787,600 | B1 | 9/2004 | Thetford et al. |
| 2004/0096469 | A1* | 5/2004 | Lewis et al. .................. 424/401 |
| 2004/0185388 | A1 | 9/2004 | Hirai |
| 2004/0211979 | A1 | 10/2004 | Shioiri et al. |
| 2005/0069648 | A1 | 3/2005 | Maruyama |
| 2006/0052504 | A1 | 3/2006 | Xia et al. |
| 2006/0293410 | A1* | 12/2006 | Tokita .................... C09D 11/30 523/160 |
| 2008/0145633 | A1* | 6/2008 | Kodas .................. B22F 1/0018 428/220 |
| 2008/0148904 | A1 | 6/2008 | Tomonari et al. |
| 2008/0202382 | A1* | 8/2008 | Carlblom et al. ............ 106/236 |
| 2009/0123732 | A1 | 5/2009 | Yukinobu et al. |
| 2010/0174046 | A1 | 7/2010 | Liu et al. |
| 2011/0313089 | A1* | 12/2011 | Fischer ............... B01F 17/0028 524/315 |
| 2014/0065387 | A1* | 3/2014 | Andre ................... C09D 11/03 428/209 |

FOREIGN PATENT DOCUMENTS

| | | |
|---|---|---|
| JP | 2006-9085 | 1/2006 |
| JP | 2006-9120 | 1/2006 |
| JP | 2006-252976 | 9/2006 |
| JP | 2008-258147 | 10/2008 |
| JP | 2009-74171 | 4/2009 |
| JP | 2009-158273 | 7/2009 |
| JP | 2009-240970 | 10/2009 |
| WO | WO 03/051562 A1 | 6/2003 |
| WO | WO 2006072959 A1 * | 7/2006 ............ B22F 1/0018 |

OTHER PUBLICATIONS

Chinese Official Action dated Nov. 4, 2013, for CN Application No. 201080037732.8.

Chinese Official Action dated Aug. 25, 2014, for CN Application No. 201310018390.0.

* cited by examiner

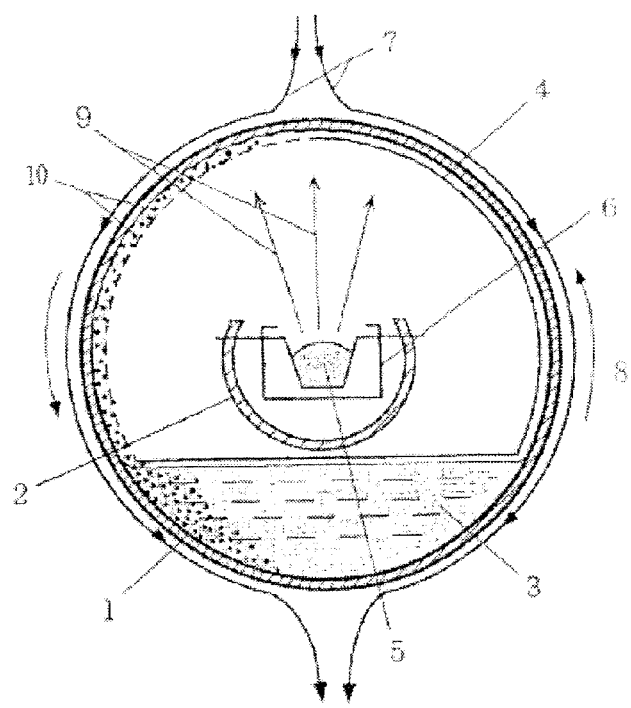

METAL MICROPARTICLE DISPERSION, PROCESS FOR PRODUCTION OF ELECTRICALLY CONDUCTIVE SUBSTRATE, AND ELECTRICALLY CONDUCTIVE SUBSTRATE

BACKGROUND OF THE INVENTION

The present invention relates to a metal microparticle dispersion having a high dispersibility, a production process for an electrically conductive substrate carried out by using the above metal microparticle dispersion and an electrically conductive substrate obtained by the above production process.

RELATED ART

A method in which a photoresist and the like are coated on a base material having a metal foil stuck thereon and in which the photoresist is exposed through a desired circuit pattern to form the pattern by chemical etching has so far been used in order to produce a circuit board in which electrically conductive wirings are provided on a base material. In the above method, a metal foil can be used as an electrically conductive wiring, and therefore an electrically conductive substrate having a small volume resistivity and a high performance can be produced. However, the above method has the defects that it has a large number of steps and is complicated and that a photoresist material is needed.

In contrast with this, attentions are paid to a method in which a pattern is printed directly on a base material by a coating material comprising metal microparticles dispersed therein. The above method in which a pattern is printed directly on a base material is a method which does not have to use a photoresist and the like and which has a very high productivity. For example, a metal oxide dispersion comprising metal oxide having a particle diameter of less than 200 nm and a dispersion medium is proposed in a patent document 1, wherein the dispersion medium contains polyhydric alcohol and/or a polyether compound. According to the patent document 1, use of the above metal oxide dispersion makes it possible to form a metal thin film on a substrate by treatment at a relatively low temperature. To be specific, a cuprous oxide microparticle dispersion prepared by dispersing cuprous oxide nanoparticles having an average particle diameter of 30 nm in ethylene glycol which is a dispersion medium is coated on a slide glass in a length of 2 cm, a width of 1 cm and a thickness of 20 µm to form a copper thin film at a burning temperature of 200° C. (refer to Example 2 in the patent document 1).

However, if the burning temperature is 200° C. or higher, the above method can not be used when a low heat resistant base material such as a polyester resin and the like is used since deformation, decoloration and the like are brought about on the base material.

On the other hand, among metal microparticles, copper microparticles have a good electrical conductivity and are available at a low cost, and therefore they are investigated in various cases to be used as a member for forming circuits on a printed wiring board. A method for forming circuits on a printed wiring board includes a method in which copper microparticles are dispersed in a dispersion medium to prepare an ink and form a circuit on a substrate by printing according to a screen printing method or an ink jet method and in which the substrate is then heated to fuse the metal microparticles thereon. In particular, since drawing by the ink jet method makes it possible to form patterns without using a plate, it can be applied to formation of patterns on demand, correction of patterns and the like, and therefore it is a suitable method (refer to a patent document 2).

When forming circuits and the like by the above method, a dispersibility of the copper microparticles is important. That is, if primary particles of the copper microparticles stay in a state in which they are notably aggregated or a size and a form of secondary particles thereof are uneven, defects are liable to be brought about when forming circuits and the like. Also, when forming circuits on a substrate by an ink jet method, clogging is caused in a discharge nozzle of an ink jet printer or a discharged ink is curved, and fine patterns are defectively formed in a certain case.

Patent document 1: International Patent Publication No. 2003/51562 pamphlet

Patent document 2: Japanese Patent Application Laid-Open No. 324966/2002

BRIEF EXPLANATION OF THE DRAWING

FIG. 1 is a schematic cross-sectional drawing of one example of an equipment used for producing a metal microparticle dispersion.

EXPLANATION OF CODES

1. Rotating drum type chamber
2. Fixing axis
3. Low vapor pressure liquid
4. Film of low vapor pressure liquid
5. Metal
6. Heating vessel
7. Water flow
8. Rotation direction
9. Atom
10. Metal microparticle

SUMMARY OF THE INVENTION

Problems that the Invention is to Solve

In order to deal with the problems described above, the present inventors proposed a process for producing an electrically conductive substrate in which a coating solution containing metal or metal microparticles is printed patternwise on a transparent base material to form a printed layer and in which the above printed layer is subjected to burning treatment to form a pattern-like metal microparticle sintered layer, wherein burning is carried out by a surface wave plasma generated by applying a microwave energy, and an arithmetic average roughness (Ra) on a surface of the base material on which the pattern of the metal microparticle sintered layer is not formed is 0.2 to 4.0 nm (Japanese Patent Application No. 60312/2009). The above electrically conductive substrate is excellent in an electric conductivity and excellent as well in an adhesive property of the base material with the electrically conductive pattern.

However, an organic material is usually used as a dispersant for dispersing metal or metal oxide microparticles contained in the coating solution, and the above organic material remains, whereby the defects that the electric conductivity is reduced and that sintering is less liable to proceed to a depth direction of the electrically conductive layer have been involved therein. In order to solve the above defects, burning for removing the organic matters has to be carried out, and the problem that the productivity is reduced has been involved therein.

Means for Solving the Problems

Intense researches repeated by the present inventors in order to solve the problems described above have resulted in finding that a specific dispersant shows a high effect to a dispersibility of metal microparticles and that it is readily volatilized at a subsequent burning step and does not prevent an electrical conductivity of a metal microparticle sintered-body. They have found that particularly when metal microparticles are copper microparticles, a specific dispersant shows a high effect to a dispersibility of the copper microparticles and that it is readily volatilized at a subsequent burning step and does not prevent an electrical conductivity of a copper microparticle sintered-body. The present invention has been completed based on the above knowledges. In the present invention, the metal microparticles shall not specifically be restricted as long as an average primary particle diameter thereof falls in a specific range, and they include, in addition to microparticles staying in a so-called metal state, microparticles staying in an alloy state and microparticles of metal compounds such as metal oxides.

That is, the present invention provides:

(1) a metal microparticle dispersion comprising metal microparticles, a polymeric dispersant and a dispersion medium, wherein an average primary particle diameter of the metal microparticles is 0.001 to 0.5 μm; the polymeric dispersant has a polyester skeleton in at least one of a principal chain and a side chain thereof; the above polyester skeleton has at least one of a constitutional unit derived from valerolactone and a constitutional unit derived from caprolactone, and a sum of the numbers of the above constitutional units is 10 or more in terms of an average value; and a content of the above polymeric dispersant is 0.1 to 100 parts by mass based on a content of 100 parts by mass of the metal microparticles, (2) a metal microparticle dispersion comprising metal microparticles, a polymeric dispersant and a dispersion medium, wherein an average primary particle diameter of the metal microparticles is 0.001 to 0.5 μm; the polymeric dispersant has a polyether skeleton in at least one of a principal chain and a side chain thereof; and a content of the above polymeric dispersant is 0.1 to 100 parts by mass based on a content of 100 parts by mass of the metal microparticles, (3) a production process for an electrically conductive substrate, comprising printing a coating solution containing the metal microparticle dispersion described in the above item (1) or (2) in a pattern-like form on a base material to form a printed layer and subjecting the above printed layer to burning treatment to form a pattern-like metal microparticle sintered film and (4) an electrically conductive substrate produced by the production process described in the above item (3).

Advantage of the Invention

In the metal microparticle dispersion of the present invention, the metal microparticles have a high dispersibility, and the above dispersibility is stably maintained. Further, since when preparing the electrically conductive substrate, the organic matters can readily be removed by burning at low temperature, sintering is liable to go on, and the electrically conductive substrate which is excellent in an electrical conductivity can be obtained. Also, since when producing the electrically conductive substrate by a microwave surface wave plasma, the organic matters originating in the dispersion medium can be removed by the above microwave surface wave plasma treatment, and a burning step for removing the organic matters does not have to be provided separately, so that the production process can be simplified. Thus, according to the production process for an electrically conductive substrate by using the metal microparticle dispersion of the present invention, the electrically conductive substrate which is excellent in an electrical conductivity can efficiently be produced.

Mode For Carrying Out The Invention

Metal Microparticle Dispersion:

The metal microparticle dispersion of the present invention comprises metal microparticles, a polymeric dispersant and a dispersion medium, wherein an average primary particle diameter of the metal microparticles is 0.001 to 0.5 μm; the polymeric dispersant has a polyester skeleton in at least one of a principal chain and a side chain thereof; the above polyester skeleton has at least one of a constitutional unit derived from valerolactone and a constitutional unit derived from caprolactone, and a sum of the numbers of the above constitutional units is 10 or more in terms of an average value; and a content of the above polymeric dispersant is 0.1 to 100 parts by mass based on a content of 100 parts by mass of the metal microparticles.

Further, the metal microparticle dispersion of the present invention comprises metal microparticles, a polymeric dispersant and a dispersion medium, wherein an average primary particle diameter of the metal microparticles is 0.001 to 0.5 μm; the polymeric dispersant has a polyether skeleton in at least one of a principal chain and a side chain thereof; and a content of the above polymeric dispersant is 0.1 to 100 parts by mass based on a content of 100 parts by mass of the metal microparticles.

The respective constitutional materials constituting the metal microparticle dispersion shall be explained below in detail.

<<Metal Microparticles>>

The metal microparticle dispersion of the present invention contains the metal microparticles. In the present specification, the metal microparticles include, in addition to microparticles staying in a metal state, microparticles staying in an alloy state and microparticles of metal compounds such as metal oxides.

The kind of the metal shall not specifically be restricted as long as it has an electrical conductivity, and it includes gold, silver, copper, nickel, platinum, palladium, tin, iron, chromium, indium, silicon, germanium and the like from the viewpoint that they have a high electrical conductivity and can readily maintain microparticles. Among them, gold, silver, copper and nickel are preferred, and copper and silver are preferred taking an electrical conductivity and an economical efficiency into consideration. The above metals may be used alone or in a mixture or an alloy of two or more kinds thereof. Further, the metal compound includes metal oxides, metal hydroxides and the like. To be specific, the compound of silver is preferably silver oxide, organic silver compounds and the like, and the compound of copper suitably includes cuprous oxide, cupric oxide or mixtures thereof. Among them, particularly the compounds of copper are preferred, and in particular, the oxides of copper (cuprous oxide, cupric oxide or mixtures thereof) are suitable.

A method for preparing the metal microparticles described above includes various methods, and they can be prepared by methods called a physical method in which they are obtained by crushing metal powders by a mechano-chemical method; chemical dry methods such as a CVD method, a deposition method, a sputtering method, a thermal plasma method, a laser method and the like; chemical wet methods such as a thermal cracking method, a chemical reduction method, an electrolytic method, an ultrasonic method, a laser ablation method, a supercritical fluid method, a microwave synthetic method and the like.

For example, in the deposition method, the metal microparticles are produced by bringing a vapor of metal which is vaporized by heating into contact with a low vapor pressure liquid containing a dispersant under high vacuum.

In order to turn the microparticles obtained to a dispersion, the microparticles are preferably coated with a protecting agent including water-soluble high polymers such as polyvinylpyrrolidone and graft-copolymerized high polymers, a surfactant and a compound having a thiol group, an amino group, a hydroxyl group and a carboxyl group which are interacted with metals. Further, depending on synthetic methods, thermally decomposed substances of raw materials and metal oxides protect particle surfaces and contribute to a dispersibility thereof in a certain case. When producing fine particles by a wet method such as a thermal decomposition method, a chemical reduction method and the like, a reducing agent and the like act, as they are, as a protecting agent for the microparticles in a certain case. Also, the microparticles may be coated directly with a polymeric dispersant as a protecting agent, which is used in the present invention as described later.

Further, in order to enhance a dispersion stability of the dispersion, the microparticles may be subjected to surface treatment, and a dispersant comprising a high polymer, an ionic compound, a surfactant and the like may be added thereto.

An average primary particle diameter of the metal microparticles described above falls in a range of 0.001 to 0.5 μm. If it falls in the above range, fusion between the metal microparticles proceeds sufficiently in an electrically conductive substrate produced by using the above metal microparticle dispersion, and the very high electrical conductivity can be obtained. From the viewpoint described above, an average primary particle diameter of the metal microparticles falls more preferably in a range of 0.002 to 0.2 μm.

The average primary particle diameter described above is measured by means of an electron microscope, and it is calculated usually according to statistical treatment from observed images measured by means of a transmission type electron microscope (TEM) and a scanning transmission type electron microscope (STEM).

A method for preparing the metal microparticles includes, as described above, various methods, and among them, a production process carried out by a vacuum deposition method which is the particularly preferred embodiment shall be described below in detail. FIG. 1 shows a specific apparatus which is preferably used in the above production process. The above apparatus is one example and shall not be restricted thereto.

In FIG. 1, a chamber 1 has a drum form in which it rotates around a fixing axis 2, and it has a structure in which an inside of the chamber 1 is exhausted at a high vacuum through the fixing axis 2. The chamber 1 is charged with a low vapor pressure liquid in which the dispersant used in the present invention is dissolved or charged with the dispersant used in the present invention, and a film 4 of the low vapor pressure liquid 3 is formed on an inner wall of the chamber 1 by rotation of the chamber 1 having a drum form. A heating vessel 6 in which metal 5 is put is fixed in an inside of the chamber 1. The metal 5 is heated up to a prescribed temperature by sending an electric current through a resistance wire, and it is vaporized and discharged into the chamber 1.

A whole part of an outer wall of the chamber 1 is cooled by a water flow 7. An atom 9 discharged from the heated metal 5 into the vacuum is introduced from a surface of the film 4 of the low vapor pressure liquid 3, and a metal microparticle 10 is formed. Then, the low vapor pressure liquid 3 in which the above metal microparticles 10 are dispersed is transported into the low vapor pressure liquid 3 present in a bottom part of the chamber 1 as the chamber 1 rotates, and at the same time, a new "film 4 of the low vapor pressure liquid 3" is supplied to an upper part of the chamber 1. The low vapor pressure liquid 3 present in a bottom part of the chamber 1 is turned into a dispersion in which the metal 5 is dispersed at a high concentration by continuing the above process.

In this connection, a method for converting the metal 5 into a gaseous matter shall not specifically be restricted. The heating temperature shall not specifically be restricted as long as it is temperature enough for the metal 5 to be turned into a gaseous state, and it is preferably 400 to 2000° C., more preferably 600 to 1800° C., further preferably 800 to 1700° C., particularly preferably 600 to 1600° C. and further preferably 800 to 1200° C.

A mechanism in which a dispersion comprising metal microparticles having a very small average primary particle diameter obtained by carrying out electron microscopic observation is obtained stably at a good dispersibility by the above preparing method does not come to be sufficiently clarified. However, it is considered that a gaseous matter of the metal is introduced directly into the low vapor pressure liquid without being coagulated in a gas phase and coagulated in the low vapor pressure liquid and that when the coagulated particles come to have a certain degree of a particle diameter, the coagulated particles are covered with the dispersant used in the present invention and stabilized in the form of nano-microparticles. It is considered that in the above case, the dispersant used in the present invention covers more quickly the coagulated particles to more strongly inhibit them from getting together with each other and makes them more stable in the form of nano-microparticles.

Dispersion Medium which is not a Low Vapor Pressure Liquid:

In a production method for the metal microparticle dispersion preferably employed in the present invention, the low vapor pressure liquid is used as a dispersion medium, and when this is hard to be dried up or removed by distillation and is inconvenient, the low vapor pressure liquid contained in the metal microparticle dispersion is preferably substituted with a dispersion medium (hereinafter referred to as the other dispersion medium) which is not a low vapor pressure liquid. The dispersion medium which is not a low vapor pressure liquid preferably includes non-polar dispersion media which are not the low vapor pressure liquid described above (for example, liquids which are not compatible with water in an optional proportion). Use of the above dispersion medium improves a dispersion stability of the metal microparticles contained in the metal microparticle dispersion obtained.

The dispersion medium (the other dispersion medium) which is not a low vapor pressure liquid can suitably be selected according to various uses of the metal microparticle dispersion. The other dispersion medium includes usually general purpose solvents or dispersants used for inks, coating materials, catalyst materials, medical cares and the like as well as solvents or dispersants for producing circuit materials, electrically conductive films, electromagnetic wave shielding materials and the like.

Capable of being preferably listed as the specific examples of the other dispersion medium are, for example, aliphatic hydrocarbons such as normal hexane, cyclohexane, normal pentane, normal heptane, octane, decane, dodecane, tetradecane, hexadecane and the like; aromatic hydrocarbons such as toluene, xylene and the like; ethers such as diethyl ether, diphenyl ether and the like; glycol base dispersion media such as propylene glycol monoethyl ether, propylene glycol monoethyl ether acetate, dipropylene glycol monoethyl ether and the like; ketones such as methyl ethyl ketone, methyl isobutyl ketone, acetylacetone, cyclohexanone and the like; esters such as butyl lactate and the like; amino group-containing alcohols such as 2-dimethylaminoethanol, 2-diethylaminoethanol, 2-dimethylaminoisopropanol, 3-diethylamino-1-propanol, 2-dimethylamino-2-propanol, 2-methylaminoethanol, 4-dimethylamino-1-butanol and the like. They may be used alone or in a mixture of two or more kinds thereof.

Substitution Method of Dispersion Medium:

A method for substituting the low vapor pressure liquid with the other dispersion medium includes publicly known methods of solvent substitution and dispersion medium substitution.

The particularly preferred dispersion medium substitution method is a dispersion medium substitution method comprising a step in which (i) a poor solvent compatible with the low vapor pressure liquid as a dispersion medium for the metal microparticle dispersion at least in a certain proportion is added to the metal microparticle dispersion to thereby settle the metal microparticles and in which (ii) the low vapor pressure liquid as a supernatant is removed. That is, preferred is the dispersion medium substitution method comprising a step in which only a mixture of the low vapor pressure liquid and the poor solvent obtained substantially as a supernatant by adding the poor solvent to the metal microparticle dispersion is removed by decantation and the like.

The poor solvent used in the method described above is preferably a solvent which is not compatible with the dispersant used in the present invention in an optional proportion, that is, a solvent which acts as a poor solvent against the metal microparticles having the dispersant used in the present invention on a surface thereof or a solvent which is compatible with the low vapor pressure liquid in the metal microparticle dispersion in a certain proportion. Further, it is particularly preferably a solvent having both properties in combination. Use of the above poor solvents enables to carry out decantation, makes it possible to suitably replace the dispersant from the low vapor pressure liquid to the other dispersants described above and provides the dispersant with an excellent maintainability before, during and after replacing the dispersion medium.

A boiling point and a vapor pressure of the poor solvent shall not specifically be restricted, but it has preferably a low boiling point and a high vapor pressure. It is preferred that after adding the poor solvent, a mixed liquid of the low vapor pressure liquid and the poor solvent is removed by decantation while allowing the settled metal microparticles to remain in the vessel and that the poor solvent is added again to repeat decantation, and it is easy to remove, if necessary, the poor solvent remaining in the last decantation by distillation under reduced pressure without heating. A boiling point of the above poor solvents at 1 atm is preferably 180° C. or lower, more preferably 150° C. or lower and particularly preferably 100° C. or lower.

The above poor solvent includes, for example, liquids containing an oxygen atom such as alcohol base solvents, ketone base solvents, ether base solvents, ester base solvents and the like. Among them, the alcohol base solvents are preferably alcohols having 3 to 6 carbon atoms, particularly preferably alcohols having 3 to 5 carbon atoms. To be specific, they include n-propanol, iso-propanol (IPA), butanol, pentanol, hexanol and the like. The ketone base solvents are preferably ketones having 2 to 8 carbon atoms, particularly preferably ketones having 2 to 6 carbon atoms. To be specific, they include acetone, methyl ethyl ketone, cyclohexanone, methyl isobutyl ketone and the like. The ether base solvents are preferably ethers having 4 to 8 carbon atoms, particularly preferably ethers having 4 to 6 carbon atoms. To be specific, they include methyl ethyl ether, diethyl ether, furan, tetrahydrofuran and the like. The ester base solvents are preferably esters having 3 to 8 carbon atoms, particularly preferably esters having 3 to 6 carbon atoms. To be specific, they include methyl acetate, ethyl acetate, propyl acetate, butyl acetate and the like.

In the poor solvents described above, if the carbon number is too small or too large, the requisites described above are not satisfied in a certain case. In particular, when the carbon number is too small, the poor solvent is not compatible with the low vapor pressure liquid in a certain case, and on the other hand, when the carbon atoms are too large, the boiling point becomes too high in a certain case as described later.

In addition to the above solvents, the poor solvents include propylene glycol monoalkyl ether acetate base solvents such as propylene glycol monomethyl ether acetate, propylene glycol monoethyl ether acetate, propylene glycol monopropyl ether acetate, propylene glycol diacetate, dipropylene glycol monomethyl ether acetate, diethylene glycol monoethyl ether acetate, dipropylene glycol monoethyl ether acetate, dipropylene glycol monopropyl ether acetate, diethylene glycol monobutyl ether acetate, dipropylene glycol monobutyl ether acetate and the like; and lactone base solvents such as γ-butyrolactone, γ-valerolactone, γ-caprolactone, γ-valerolactone, δ-caprolactone and the like. They are used alone or in a mixed solvent of two or more kinds thereof.

The poor solvent in the present invention is particularly preferably the alcohol base solvents or the ester base solvents among the solvents described above from the viewpoints that they satisfy the requisites described above and make it easy to carry out decantation and that they are liable to be redispersed when adding "the other dispersant" after carrying out the decantation.

Copper Microparticle:

In the present invention, the metal microparticles particularly preferably include microparticles of copper among the metals shown as the examples of the kind of the preferred metals.

The copper microparticles have a high electrical conductivity and can readily maintain microparticles, and they are excellent in an economical efficiency and a migration resistance in addition to an electrical conductivity. In this connection, the copper microparticles mean microparticles staying in a state of metal, and it includes as well the microparticles which are oxidized on a surface.

In the present invention, when the copper microparticles are used as the metal microparticles, an average primary particle diameter thereof falls preferably in a range of 0.001 to 0.5 μm. If it falls in the above range, fusion between the copper microparticles proceeds sufficiently in an electric conductive substrate produced by using a dispersion of the above copper microparticles, and the very high electrical conductivity can be obtained. A smaller average primary particle diameter of the copper microparticles makes it easy to allow fusion between the copper microparticles to proceed sufficiently, but the too small average primary particle diameter makes a surface thereof liable to be oxidized and makes the microparticles hard to be sintered, and it makes the microparticles liable to be coagulated and reduces a dispersibility thereof. From the above viewpoints, an average primary particle diameter of the copper microparticles falls more preferably in a range of 0.002 to 0.2 µm.

The average primary particle diameter described above is measured by means of an electron microscope, and it is calculated usually according to statistical treatment from observed images measured by means of a transmission type electron microscope (TEM) and a scanning transmission type electron microscope (STEM).

A method for preparing the copper microparticles includes various methods, and they can be prepared by physical methods in which they are obtained by crushing metal powders by a mechanochemical method and the like; chemical dry methods such as a CVD method, a deposition method, a sputtering method, a heat plasma method, a laser method and the like; methods called chemical wet methods which are carried out by a thermal cracking method, a chemical reducing method, an electrolytic method, a supersonic method, a laser abrasion method, a supercritical fluid method, a microwave synthetic method and the like.

In, for example, the deposition method, vapor of metal evaporated by heating is brought into contact with a low vapor pressure liquid containing a dispersant under high vacuum to produce microparticles.

In the present invention, the copper microparticles are formed preferably by mixing divalent copper oxide with a reducing agent in a medium under the presence of a complexing agent and a protective colloid by a method which is one kind of the chemical reducing method described above.

In this connection, the divalent copper oxide is copper having an atomic value of 2 and includes cuprous oxide, cuprous hydroxide and a mixture thereof. Also, monovalent copper oxide and impurities such as other metals and the like may be contained in the divalent copper oxide as long as the effects of the present invention are not inhibited, but it is preferred that the monovalent copper oxide is not substantially contained.

Complexing Agent:

The complexing agent used in the method for preparing copper microparticles described above is used for combining a donor atom of a ligand present in the above complexing agent with a copper ion or metal copper to form a copper complex compound. The donor atom includes suitably nitrogen, oxygen and sulfur, and they may be used alone or in combination of two or more kinds thereof.

To be more specific, the complexing agent in which nitrogen is a donor atom includes nitrogen-containing heterocyclic compounds such as amines, imidazole, pyridine and the like, nitriles, cyan compounds, ammonia, ammonium compounds, oximes and the like.

Also, the complexing agent in which oxygen is a donor atom includes carboxylic acids, ketones, aldehydes, alcohols, quinones, ethers, phosphoric acid, phosphoric acid base compounds, sulfonic acid, sulfonic acid base compounds and the like.

Further, the complexing agent in which sulfur is a donor atom includes aliphatic thiols, alicyclic thiols, aromatic thiols, thioketones, thioethers, polythiols, thiocarbonic acids, sulfur-containing heterocyclic compounds, thiocyanates, isothiocyanates, inorganic sulfur compounds and the like.

Also, in respect to the complexing agent having two or more donor atoms, the complexing agent having nitrogen and oxygen includes amino acids, aminopolycarboxylic acids, alkanolamines, nitroso compounds, nitrosyl compounds and the like; the complexing agent having sulfur and oxygen includes mercaptocarboxylic acids, thioglycols, thionic acids, thiocarbonic acids and the like; the complexing agent having sulfur and nitrogen includes aminothiols, thioamides, thioureas, thiazoles and the like; and the complexing agent having sulfur, nitrogen and oxygen includes sulfur-containing amino acids and the like.

A blend amount of the complexing agent is 0.001 to 20 parts by mass based on 100 parts by mass of the divalent copper oxide. If it falls in the above range, a high dispersibility of copper is obtained. Decreasing a blend amount of the complexing agent in the above range makes it possible to reduce a primary particle diameter of the copper microparticles, and on the other hand, increasing a blend amount thereof makes it possible to increase a primary particle diameter of the copper microparticles. In the present invention, a blend amount of the complexing agent falls more preferably in a range of 0.05 to 15 parts by mass based on 100 parts by mass of the divalent copper oxide.

Protective Colloid:

The protective colloid used in the method for preparing the copper microparticles described above acts as a dispersion stabilizer for the copper microparticles formed, and various colloids can be used. To be specific, it includes protein base colloids such as gelatin, gum arabic, casein, sodium caseinate, ammonium caseinate and the like; natural high polymers such as starch, dextrin, agar, sodium alginate and the like; cellulose base colloids such as hydroxyethyl cellulose, methyl cellulose and the like; vinyl base colloids such as polyvinyl alcohol, polyvinylpyrrolidone and the like; acrylic acid base colloids such as poly-sodium acrylate, poly-ammonium acrylate and the like; polyethylene glycol and the like.

Among them, the protein base protective agents are particularly preferred from the viewpoint of a dispersion stability.

A blend amount of the protective colloid falls in a range of preferably 1 to 100 parts, more preferably 2 to 50 parts by mass based on 100 parts by mass of the divalent copper oxide. If it falls in the above ranges, the copper microparticles formed are liable to be dispersed and stabilized.

Reducing Agent:

A reducing agent having a strong reducing power is preferably used as the reducing agent used in the method for preparing the copper microparticles described above so that a monovalent copper oxide compound is not formed during the reduction reaction. To be specific, it includes hydrazine base reducing agents such as hydrazine, hydrazine compounds and the like, sodium boron hydride, sodium sulfite, sodium bisulfite, sodium thiosulfate, sodium nitrite, sodium hyponitrite, phosphorous acid, sodium phosphite, hypophosphorous acid, sodium hypophosphite and the like. Particularly, the hydrazine base reducing agents are preferred since they have a strong reducing power. They can be used alone or in combination of two or more kinds thereof.

A use amount of the reducing agent falls preferably in a range of 0.2 to 5 mole based on 1 mole of copper contained in the divalent copper oxide. If it is 0.2 mole or more, the reduction proceeds sufficiently, and the copper microparticles are obtained. On the other hand, if it is 5 mole or less, the copper microparticles having a desired particle diameter are obtained. From the above viewpoints, a preferred use amount of the reducing agent falls in a range of 0.3 to 2 mole based on 1 mole of copper contained in the divalent copper oxide.

Medium:

Water base solvents such as water and the like and organic solvents such as alcohols and the like can be used as a medium used in preparing the copper microparticles, and the water base solvents are more preferred.

Preparation of the Copper Microparticles:

A reaction temperature in preparing the copper microparticles falls in a range of preferably 10° C. to a boiling point of the medium, and it falls in a range of preferably 40 to 95° C., more preferably 80 to 95° C. from the viewpoint of obtaining the fine copper microparticles. Also, the pH falls in a range of preferably 3 to 12, and the reaction time is, though varied depending on a concentration of the reducing agent and the like, usually 10 minutes to 6 hours.

Polymeric Dispersant:

A polymeric dispersant used in the present invention is characterized by having a prescribed polyester skeleton or polyether skeleton in at least one of a principal chain or a side chain thereof.

The above polymeric dispersant is liable to be decomposed due to a skeleton structure thereof by burning at low temperature and irradiation with a microwave surface wave plasma, and organic matters are less liable to remain, so that the satisfactory electrical conductivity is obtained. Particularly the polymeric dispersant having a polyether skeleton in at least one of a principal chain or a side chain thereof is preferred since it is liable to be decomposed by a microwave surface wave plasma.

The polymeric dispersant used in the present invention has preferably a comb type structure having at least one side chain (branched part) from the viewpoint of a dispersion stability of the metal microparticle dispersion. The polymeric dispersant having the above structure provides an excellent dispersion stability only by using a small amount thereof, and the metal microparticle dispersion which is excellent in a sintering property at low temperature can be obtained. In addition thereto, it can provide an electrically conductive substrate obtained by using the above dispersion with an excellent electrical conductivity.

A molecular weight of the polymeric dispersant falls in a range of preferably 500 to 20000 in terms of a weight average molecular weight reduced to polystyrene from the viewpoint of a dispersibility of the metal microparticles. In this connection, the weight average molecular weight is a value measured by GPC (gel permeation chromatography).

Further, in the present invention, two or more kinds of the polymeric dispersants can be used as well in a mixture.

In respect to the polymeric dispersant having a polyester skeleton in a principal chain, the above polyester skeleton has, as shown in the following Formula (I), at least one of a constitutional unit (unit) derived from valerolactone and a constitutional unit (unit) derived from caprolactone, and a sum (corresponding to m in the following Formula (I)) of the numbers of the constitutional unit (unit) derived from valerolactone and the constitutional unit (unit) derived from caprolactone is 10 or more in terms of an average value. Further, it falls in a range of more preferably 10 to 18 from the viewpoint of a dispersibility of the metal microparticles.

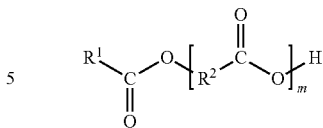

(in Formula (I), $R^1$ is a linear or branched alkyl group having 1 to 18 carbon atoms, a phenyl group, a phenyl group substituted with a linear or branched alkyl group having 1 to 18 carbon atoms, a phosphoric acid group or a sulfonic acid group; $R^2$ is a linear or branched alkylene group having 2 to 8 carbon atoms; m represents a number of 1 to 20; provided that at least one of m units of the repetitive units is a constitutional unit derived from valerolactone or a constitutional unit derived from caprolactone).

In the present invention, the phosphoric acid group means a group represented by the following Formula (a) and includes a phosphoric ester group.

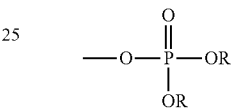

(R each is independently hydrogen, a linear or branched alkyl group having 1 to 18 carbon atoms, a phenyl group or a phenyl group substituted with a linear or branched alkyl group having 1 to 18 carbon atoms).

Further, in the present invention, the sulfonic acid group means a group represented by the following Formula (b) and includes a sulfonic ester group.

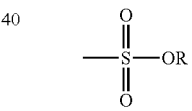

(R is hydrogen, a linear or branched alkyl group having 1 to 18 carbon atoms, a phenyl group or a phenyl group substituted with a linear or branched alkyl group having 1 to 18 carbon atoms).

The compound represented by Formula (I) is synthesized by using monocarboxylic acid as a starting material and obtained by subjecting lactones represented by Formula (II) to ring-opening addition reaction:

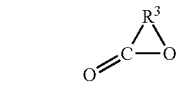

In Formula (II), $R^3$ represents a linear or branched alkylene group having 2 to 8 carbon atoms. In the lactones represented by Formula (II), $R^3$ is more preferably an alkylene group having 2 to 6 carbon atoms and suitably includes, for example, ε-caprolactone, β-propiolactone, δ-valerolactone and the like. In the ring-opening addition reaction, the above lactones may be used alone or in a mixture of plural kinds of the lactones, and at least either one of ε-caprolactone and δ-valerolactone is contained therein.

Next, the polymeric dispersant having a polyether skeleton in a principal chain includes a dispersant represented by the following Formula (III) as the preferred embodiment.

$$R^4O\text{—}(R^5O)_n\text{—}H \tag{III}$$

In Formula (III), $R^4$ is a linear or branched alkyl group having 1 to 18 carbon atoms, a phenyl group, a phenyl group substituted with a linear or branched alkyl group having 1 to 18 carbon atoms, a phosphoric acid group or a sulfonic acid group; $R^5$ is a linear or branched alkylene group having 2 to 4 carbon atoms; and n represents a number of 1 to 30. The phosphoric acid group and the sulfonic acid group are the same as described above. The phosphoric acid group is suitably the group represented by Formula (a) described above, and the sulfonic acid group is suitably the group represented by Formula (b) described above.

The compound represented by Formula (III) is synthesized by using alcohol as a starting material and obtained by subjecting alkylene oxide represented by Formula (IV) to ring-opening addition reaction:

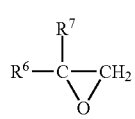
(IV)

In Formula (IV), $R^6$ is hydrogen, methyl group or ethyl group, and $R^7$ is hydrogen or methyl group. When $R^6$ is methyl group, $R^7$ is hydrogen. Among the alkylene oxides represented by Formula (IV), ethylene oxide and propylene oxide are particularly preferred.

In the ring-opening addition reaction, the above alkylene oxides may be used alone or in a mixture of plural kinds of the alkylene oxides, and at least either one of ethylene oxide and propylene oxide is preferably contained therein. That is, in the polymeric dispersant having a polyether skeleton in a principal chain, the above polyether skeleton has preferably at least one of polyethylene glycol derived from ethylene oxide and polypropylene glycol derived from propylene oxide as a constitutional unit (unit).

Further, a sum (corresponding to n described above) of the numbers of the polyethylene glycol unit and the polypropylene glycol unit is 10 or more in terms of an average value from the viewpoint of a dispersibility of the metal microparticles, and it falls in a range of particularly preferably 10 to 18.

Next, when the polymeric dispersant used in the present invention has a polyester skeleton or a polyether skeleton in a side chain, the principal chain is preferably a polyamine or polyimine skeleton. The structures of the polyester skeleton and the polyether skeleton each constituting the side chain are the same as the structures of the polyester skeleton and the polyether skeleton each constituting the principal chain described above.

When the principal chain is a polyamine skeleton, the above skeleton is preferably polyallylamine represented by the following Formula (V):

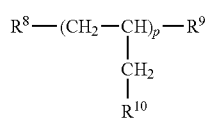
(V)

In Formula (V), $R^8$ and $R^9$ each are independently any of hydrogen or a polymerization initiator residue, and $R^{10}$ is hydrogen or a group represented by the following Formula (VI). Further, p is 2 to 20, more preferably 2 to 8. Provided that at least one of p groups of $R^{10}$ is represented by Formula (VI) and that $R^H$ has a group represented by the following Formula (VII):

$$NHCOR^{11} \tag{VI}$$

wherein $R^{11}$ is a linear or branched, saturated or unsaturated monovalent hydrocarbon group having 1 to 20 carbon atoms or a group represented by the following Formula (VII):

(VII)

wherein $R^{12}$ represents a linear or branched, saturated or unsaturated divalent hydrocarbon group having 1 to 20 carbon atoms; $R^{13}$ represents a linear or branched alkylene group having 2 to 8 carbon atoms; and q represents a number of 1 to 20. Further, the polyester skeleton in Formula (VII) has preferably, as described above, at least one of a constitutional unit (unit) derived from valerolactone and a constitutional unit (unit) derived from caprolactone, and a sum (q described above) of the numbers of the constitutional unit (unit) derived from valerolactone and the constitutional unit (unit) derived from caprolactone is preferably 10 or more in terms of an average value from the viewpoint of a dispersibility of the metal microparticles, and it falls in a range of particularly preferably 10 to 18.

Next, when the principal chain is a polyimine skeleton, the above skeleton is preferably polyethyleneimine represented by the following Formula (VIII):

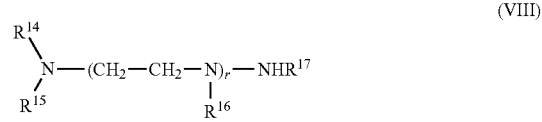
(VIII)

wherein $R^{14}$ and $R^{15}$ each are independently any of hydrogen or a polymerization initiator residue; $R^{16}$ and $R^{17}$ each are independently hydrogen or a group represented by the following Formula (IX); r is 2 to 20, more preferably 2 to 8; provided that at least one of r groups of $R^{16}$ is represented by Formula (IX) and that $R^{18}$ has a group represented by the following Formula (X):

$$CH_2\text{—}CH_2\text{—}NHCOR^{18} \tag{IX}$$

wherein $R^{18}$ is a linear or branched, saturated or unsaturated monovalent hydrocarbon group having 1 to 20 carbon atoms or a group represented by the following Formula (X):

(X)

wherein $R^{19}$ represents a linear or branched, saturated or unsaturated divalent hydrocarbon group having 1 to 20 carbon atoms; $R^{20}$ represents a linear or branched alkylene group having 2 to 8 carbon atoms; and s represents a number of 1 to 20. Further, the polyester skeleton in Formula (X) has preferably, as described above, at least one of a constitutional unit (unit) derived from valerolactone and a constitutional unit (unit) derived from caprolactone, and a sum (s described above) of the numbers of the constitutional unit (unit) derived from valerolactone and the constitutional unit (unit) derived from caprolactone is preferably 10 or more in terms of an average value from the viewpoint of a dispersibility of the metal microparticles, and it falls in a range of particularly preferably 10 to 18.

A content of the polymeric dispersant in the metal microparticle dispersion of the present invention falls in a range of preferably 0.1 to 100 parts by mass based on a content of 100 parts by mass of the metal microparticles. If it is 0.1 part by mass or more, a dispersibility of the metal microparticles is ensured, and if it is 100 parts by mass or less, organic substances originating in the dispersant can readily be removed by burning. From the viewpoints described above, a content of the polymeric dispersant falls in a range of more preferably 1 to 50 parts by mass <<Dispersion Medium>>

Water and/or organic dispersion media can be used as a dispersion medium used for the metal microparticle dispersion of the present invention. The organic dispersion media include aliphatic hydrocarbons such as hexane, decane, dodecane, tetradecane and the like; alicyclic hydrocarbons such as cyclohexane and the like; aromatic hydrocarbons such as toluene, xylene and the like; ketones such as acetone, methyl ethyl ketone, methyl isobutyl ketone and the like; esters such as methyl acetate, ethyl acetate, propyl acetate, butyl acetate, isobutyl acetate and the like; alcohols such as methanol, ethanol, n-propanol, isopropanol, n-butanol, ethylene glycol, diethylene glycol, triethylene glycol, propylene glycol, glycerin and the like; ethers such as tetrahydrofuran, dioxane, ethylene glycol monomethyl ether (methyl cellosolve), ethylene glycol monoethyl ether (ethyl cellosolve), ethylene glycol monobutyl ether (butyl cellosolve) and the like.

Among them, the aliphatic hydrocarbons, the aromatic hydrocarbons, the ketones, the esters and the alcohols are preferred from the viewpoint of a dispersibility of the metal microparticles and the like. The above dispersion media can be used alone or in a mixture of two or more kinds thereof.

A solid matter concentration of the metal microparticle dispersion in the present invention falls in a range of preferably 5 to 90% by mass, and an amount of the dispersion medium is determined so that the concentration falls in the above range. If the solid matter concentration is 5% by mass or more, the sufficiently high electrical conductivity is obtained, and if it is 90% by mass or less, a dispersibility of the metal microparticles is ensured. From the viewpoints described above, a solid matter concentration of the metal microparticle dispersion falls in a range of more preferably 10 to 50% by mass.

<<Production Process for the Metal Microparticle Dispersion>>

In the present invention, a production process for the metal microparticle dispersion includes preferably a process in which the polymeric dispersant is added in advance to the dispersion medium or the medium used in synthesizing the metal microparticles and a process in which the polymeric dispersant is added in dispersing the metal microparticles in the dispersion medium (or the medium).

Further, it includes as well a process in which the metal microparticles obtained is dispersed in the polymeric dispersant. In this case, the metal microparticles can be dispersed by media dispersion such as a bead mill and the like and medialess dispersion making use of a supersonic wave and a fluid pressure.

Production Process for an Electrically Conductive Substrate:

Next, a production process for an electrically conductive substrate using the metal microparticle dispersion described above shall be explained in detail.

In the production process of the present invention, a coating solution containing the metal microparticle dispersion described above is printed pattern-wise on a base material to form a printed layer, and the above printed layer is subjected to burning treatment to form a pattern-like metal microparticle sintered film. In this regard, the pattern-like metal microparticle sintered film shall be referred to as "the electrically conductive pattern". In this connection, a case in which it is referred to as "the electrically conductive pattern" means a case in which the metal microparticles stay in a so-called metallic state and have an electrical conductivity. Further, when the metal microparticles comprise a metal compound such as metal oxide and the like, the metal compound has to be reduced in order to obtain the metal microparticle sintered film having an electrical conductivity. The metal microparticle sintered film having an electrical conductivity is obtained by burning under reducing gas atmosphere of, for example, hydrogen and the like.

<<Base Material>>

The base material used in the present invention shall not specifically be restricted as long as it is used for an electrically conductive substrate, and capable of being used are, for example, glasses such as soda lime glass, non-alkali glass, borosilicate glass, high strain point glass, quartz glass and the like and inorganic materials such as alumina, silica and the like. Further, high polymer materials, papers and the like can be used as well. Also, in the present invention, since the metal microparticles are sintered, as described later in detail, at low temperature to form an electrically conductive thin film, the base material is not damaged, and specific glass having a high heat resistance such as high strain point glass and the like does not have to be used to make it possible to use even usual soda lime glass and the like having a low heat resistance. Further, high polymer materials such as plastics and the like and papers can be used as well for the base material, and in particular, it is very useful in terms of being able to use a resin film.

Capable of being listed as materials used for the above resin film are polyimide, polyamide, polyamideimide, polyethylene terephthalate (PET), polyethylene naphthalate (PEN), polyphenylene sulfide, polyetherether ketone, polyether sulfone, polycarbonate, polyetherimide, epoxy resins, phenol resins, glass-epoxy resins, polyphenylene ether, acryl resins, polyolefins such as polyethylene, polypropylene and the like, liquid crystalline high polymer compounds and the like.

A thickness of the base material shall not specifically be restricted, and it falls usually in a range of 10 to 300 µm in a case of a plastic base material such as a resin film and the like. If the thickness is 10 µm or more, the base material is inhibited from being deformed in forming an electrically conductive pattern, and it is suitable in terms of a form stability of the electrically conductive pattern formed. Also, if it is 300 µm or less, it is suitable in terms of a flexibility in carrying out continuously a winding processing.

On the other hand, when the base material is an inorganic material, a thickness thereof is usually 0.1 to 10 mm, preferably 0.5 to 5 mm.

<<Coating Solution Containing the Metal Microparticle Dispersion>>

A coating solution used in the production process of the present invention is characterized by containing the metal microparticle dispersion described above. The metal microparticle dispersion of the present invention is provided with a high dispersibility and a high stability by using the specific polymeric dispersant. In addition thereto, the discharge stability is high when carrying out printing by an ink jet system, and the good patterning aptitude is obtained.

Further, a dispersion medium in addition to the metal microparticle dispersion described above may be added to the above coating solution in order to enhance a patterning aptitude thereof. The dispersion medium used above may be the same as or different from the dispersion medium used in the production step of the metal microparticle dispersion.

The above coating solution can suitably be blended with additives such as a surfactant, a plasticizer, a fungicide and the like in addition to the metal microparticle dispersion. Further, a dispersant having a low molecular weight may be blended in order to enhance further the dispersibility.

Among the above additives, the surfactant can enhance further a dispersibility of the metal microparticles and improve the coating property, and therefore it can suitably be blended. The surfactant includes, to be specific, cationic surfactants such as quaternary ammonium salts and the like; anionic surfactants such as carboxylates, sulfonates, sulfuric ester salts, phosphoric ester salts and the like; and nonionic surfactants such as ether type surfactants, ester type surfactants, etherester type surfactants and the like.

Further, a polyester resin, an acryl resin, a urethane resin and the like may be added as a resin binder to the coating solution for the purposes of enhancing a film-forming property, providing a printing aptitude and raising a dispersibility. Further, a viscosity controlling agent, a surface tension controlling agent, a stabilizer and the like may be added if necessary.

A solid matter concentration of the coating solution of the present invention is suitably determined according to a method for coating it on the base material. In a case of, for example, an ink jet system, the solid matter concentration is adjusted to 5 to 60% by mass. If the solid matter concentration falls in the above range, the viscosity is sufficiently low, and the coating solution is readily printed on the base material.

Printing Method:

A method for printing the coating solution on the base material to form a printed layer shall not specifically be restricted, and capable of being used are methods such as gravure printing, screen printing, spray coating, spin coating, comma coating, bar coating, knife coating, offset printing, flexographic printing, ink jet printing, dispenser printing and the like. Among them, gravure printing, flexographic printing, screen printing and ink jet printing are preferred from the viewpoint that fine patterning can be carried out. In particular, the metal microparticle dispersion of the present invention is excellent in a dispersibility, and therefore it is prevented from causing clogging in a discharge nozzle for ink jet and bringing about discharge curving and is suited to ink jet printing.

Further, the coating solution can be printed directly on the base material in a desired pattern according to the process of the present invention, and therefore the productivity can notably be enhanced as compared with methods in which conventional photoresists are used.

The coating solution on the base material may be dried by an ordinary method after printed. A film thickness of the printed part after dried can be controlled by suitably changing the coating amount and an average primary particle diameter of the metal microparticles according to the uses and the like, and it falls in a range of usually 0.01 to 100 μm, preferably 0.1 to 50 μm.

<<Burning Treatment>>

Burning in the production process of the present invention can be carried out by heating up to temperature at which the metal microparticles are sintered or by a surface wave plasma (hereinafter referred to as a microwave surface wave plasma) generated by applying a microwave energy. Among them, it is carried out preferably by the microwave surface wave plasma in the present invention. Use of the microwave surface wave plasma makes it possible to reduce heat damage exerted on the base material. Further, the base material can be prevented from being roughened on a surface thereof, and therefore when a transparent base material is used, a transparency of the base material other than a part on which an electrically conductive pattern is formed is secured, so that the electrically conductive base material having a high transparency is obtained.

Further, the burning treatment carried out by the microwave surface wave plasma makes it possible to carry out burning treatment of a large area for short time, and therefore the productivity is very high.

Further, the burning by using the microwave surface wave plasma is carried out preferably under inert gas atmosphere or reducing gas atmosphere from the viewpoint of an electrical conductivity of the metal microparticle sintered film.

In the present invention, the microwave surface wave plasma is generated particularly preferably under reducing gas atmosphere, and especially it is generated preferably under hydrogen gas atmosphere. This allows insulating oxides present on a surface of the metal microparticles to be reduced and removed, and an electrically conductive pattern having a good electrically conductive performance is formed.

The reducing gas for forming the reducing atmosphere includes gases such as hydrogen, carbon monoxide, ammonia and the like and mixed gases thereof, and a hydrogen gas is particularly preferred in terms of producing less by-products.

The reducing gas has the effect that plasma is liable to be generated by using a mixture of the reducing gas with an inert gas such as nitrogen, helium, argon, neon, krypton, xenon and the like.

Before carrying out the microwave surface wave plasma treatment, burning is preferably carried out at a temperature of 50 to 200° C. for 10 minutes to 2 hours under the air or atmosphere containing oxygen in order to remove organic matters such as the dispersant and the like contained in the printed layer on which the coating solution containing the metal microparticle dispersion is printed. The organic matters are removed by oxidation and decomposition by the above burning, and sintering of the metal microparticles is accelerated in the microwave surface wave plasma treatment. In the present invention, use of the specific dispersant as the polymeric dispersant makes it possible, as described above, to carry out the burning treatment at a lower temperature or omit the burning treatment carried out before the above microwave surface wave plasma treatment.

To be more specific, when a resin film such as polyethylene terephthalate (PET), polyethylene naphthalate (PEN) and the like is used as the base material, the burning treatment is carried out preferably on a temperature condition of 165° C. or lower in order to inhibit deformation by heat. Further, in the above burning treatment, burning is carried out preferably in two burning steps of (i) a step in which burning is carried out at 165° C. or lower under atmosphere containing oxygen and (ii) a step in which burning is carried out at 165° C. or lower under inert gas atmosphere and/or reducing gas atmosphere by using a microwave surface wave plasma. It is because the more minute electrically conductive film can be obtained. In this connection, the oxygen concentration under atmosphere containing oxygen shall not specifically be restricted, and the oxygen concentration is preferably 0.1 to 30%. That is, "under atmospheric atmosphere" is included in "under atmosphere containing oxygen". If the oxygen concentration is 0.1% or more, decomposition of the organic matters is accelerated, and if it is 30% or less, the safety is high. Accordingly, both are preferred.

In the metal microparticle dispersion of the present invention, it is estimated that the polymeric dispersant added is adsorbed on the metal microparticles in some manner. It is considered that the above dispersion is reduced in an adsorptive power by burning it in the air or under atmosphere containing oxygen and that decomposition of the polymeric dispersant is accelerated by burning under inert gas atmosphere and/or reducing gas atmosphere by using a microwave surface wave plasma, so that a minute electrically conductive film is obtained.

Generating Method for Microwave Surface Wave Plasma:

A generating method for the microwave surface wave plasma described above shall not specifically be restricted, and capable of being used is, for example, an electrodeless plasma generating means in which a microwave energy is supplied through an irradiation window of a burning treatment chamber staying in a reduced pressure state to generate a surface wave plasma along the irradiation window in the above burning treatment chamber.

In the plasma generating means described above, a microwave energy having a frequency of 2450 MHz is supplied, for example, through an irradiation window of the burning treatment chamber to make it possible to generate a microwave surface wave plasma having an electron temperature of about 1 eV or less and an electron density of about $1 \times 10^{11}$ to $1 \times 10^{13}$ cm$^{-3}$ in the above burning treatment chamber.

In general, a microwave energy is an electromagnetic wave having a frequency of 300 MHz to 3000 GHz, and an electromagnetic wave having a frequency of, for example, 2450 MHz is used. In this case, it has a frequency range of 2450 MHz/±50 MHz for the sake of an accuracy error of a magnetron which is a microwave oscillation equipment.

Effects of Microwave Surface Wave Plasma:

The above microwave surface wave plasma has the characteristics that a plasma density is high and that an electron temperature is low, and the printed layer described above can be subjected to burning treatment at low temperature for short time to make it possible to form a minute and flat metal microparticle sintered film. In the microwave surface wave plasma, a plasma having an even density within a surface is radiated to a treated surface. As a result thereof, partial sintering of the particles within a surface is prevented from proceeding, and an uneven film is formed in less cases as compared with other burning methods. Further, the particles can be prevented from growing, and therefore a very minute and flat film is obtained. Also, since an electrode does not have to be provided in an in-plane treating chamber, contamination due to impurities originating in the electrode can be prevented, and a treated material can be prevented from being damaged by abnormal discharge.

Further, the microwave surface wave plasma has a low electron temperature, and therefore it is estimated that it has a small ability of etching the base material and that damage against the plastic base material can be reduced.

The microwave surface wave plasma is suited, as described above, for enhancing an adhesive property of the metal microparticle sintered film to the resin base material. The reason therefor is estimated to be attributable to that the microwave surface wave plasma is liable to generate polar functional groups such as a hydroxyl group, a carboxyl group and the like in an interface to the metal microparticle sintered film. In particular, it is estimated that when a plasma generated under reducing gas atmosphere is used to a polyester base material, a plasma of a gas having a reducing gas is reacted with an ester bond of the base material to bring about modification in an interface side of the base material and that a reactive group having a high polarity is generated in a large amount, so that an adhesive property in an interface between the metal microparticle sintered film and the base material is improved.

Accordingly, the method of the present invention is excellent in terms of a flat interface between the base material and the electrically conductive pattern and a high adhesive property thereof as compared with a method in which a base material surface is roughened in advance by plasma treatment and the like in a conventional manner to enhance an adhesive property thereof to an electrically conductive pattern.

As shown above, a thickness of the metal microparticle sintered film formed by carrying out burning treatment by the microwave surface wave plasma is 10 nm to 50 82 m, preferably 50 nm to 5 μm and more preferably 100 to 2000 nm.

The electrically conductive substrate of the present invention is, as described above, an electrically conductive substrate prepared by coating pattern-wise a coating solution containing a metal microparticle dispersion on a base material to form a printed layer and subjecting the above printed layer to burning treatment to form a pattern-like metal microparticle sintered film.

Also, in the electrically conductive substrate of the present invention, a volume resistivity of a pattern (electrically conductive pattern) in the metal microparticle sintered film is preferably $1.0 \times 10^{-4}$ Ω·cm or less.

The electrically conductive substrate of the present invention is an electrically conductive substrate which has a pattern-like metal microparticle sintered film provided on a base material with a good adhesive property and which is excellent in a reliability and an electrical conductivity.

Electronic members prepared by using the above electrically conductive substrate of the present invention can effectively be used for electromagnetic wave shielding films having a low surface resistance, electrically conductive films, flexible printed wiring boards and the like.

EXAMPLES

Next, the present invention shall be explained in further details with reference to examples, but the present invention shall by no means be restricted by the examples.

1. Method for Determining Structure of Dispersant:

The following method was used as a method for determining the structure of the polymeric dispersant used in the present invention.

The dispersant was diluted for treatment before measurement by tetrahydrofuran (THF) so that a sample concentration was 0.5%, and after left standing still and filtered, a styrene-reduced molecular weight thereof was measured by a gel permeation chromatographic method (measuring apparatus: "HLC8220 GPC" manufactured by Tosoh Corp.) to determine a side chain number thereof. Further, an amine value thereof was determined by a titration method, and the respective derivatives were determined by an infrared spectroscopy (IR) and a nuclear magnetic resonance method (NMR) to show the structures of the principal chain and the side chains.

2. Evaluation Methods:

The metal microparticle dispersions and the electrically conductive substrates obtained in the examples were evaluated by the following methods.

(1) Measurement of particle diameter and evaluation of dispersibility (scanning transmission type electron microscope (STEM) observation):

A scanning transmission type electron microscope (STEM) "S-4800" manufactured by Hitachi High-Technologies Corporation was used to observe the metal microparticles and the metal microparticle dispersions at an accelerating voltage of 30 kV and an emission current of 10 μA by image observation by means of STEM attached to the above equipment to evaluate the dispersibility. An average primary particle diameter of the metal microparticles was determined by extracting optional 100 particles from the image obtained, measuring the particle diameters thereof and averaging them.

(2) Ink Jet Printing Aptitude:

The ink jet printing aptitude was evaluated by means of a printer "DMP-2831" (manufactured by FUJI FILM Dimatix, Inc.) using a cartridge head having a discharge amount of 10 pL.

(3) Electrical Conductivity (Surface Resistance):

The metal microparticle sintered film was brought into contact with four probes by means of a surface resistance meter ("Loresta GP", PSP type probe, manufactured by Mitsubishi Chemical Analytech Co., Ltd.) to measure the surface resistance by a four probe method.

(4) Film Thickness and Sintering Depth:

A sintering depth of the film was determined by observing the cross section by means of a scanning transmission type electron microscope (STEM).

Observation was carried out at an accelerating voltage of 30 kV and an accelerating current of 10 μA by means of the scanning transmission type electron microscope "S-4800" manufactured by Hitachi High-Technologies Corporation. The sample was cut by means of a microtome to observe a cross section thereof, whereby a film thickness of the sintered film was measured. Further, whether or not the sintered film could be sintered evenly in a depth direction was evaluated by confirming visually the observed image. A case in which the film could be sintered evenly up to the vicinity of the substrate was rated as good, and a case in which the film could not be sintered evenly was rated as inferior.

Production Example 1A (Metal Microparticle Dispersion)

A Lion diffusion pump oil A (manufactured by Lion Corporation) 360 g which was a low vapor pressure liquid was used as a dispersant, and Solsperse 39000 (principal chain: polyethyleneimine skeleton, side chain: having 6 valerolactone units on an average and 6 caprolactone units on an average in three side chains, manufactured by Lubrizol Corporation) 40 g which was a polymeric dispersant was added thereto and stirred to obtain a polymeric dispersant-containing dispersion medium.

Metal copper was used to produce a metal microparticle dispersion by means of an equipment shown in FIG. 1. That is, 5 g of a granulated copper lump (manufactured by Fruuchi Chemical Corporation) was put in a vessel 6, and the dispersion medium described above was put in a rotary drum type chamber 1. A pressure in an inside of the chamber was reduced to $10^{-3}$ Pa by vacuuming by means of a vacuum pump. Then, the chamber was rotated while cooling by flowing water, and an electric current was passed through a heater provided in a lower part of the vessel to raise an electric current value thereof until copper was molten and vaporized.

The copper grains were molten and vaporized, and a gas of copper was introduced into the dispersion medium by bringing into contact with a surface of the dispersion medium, whereby a metal microparticle dispersion was formed.

IPA 900 g was added to 100 g of the metal microparticle dispersion thus obtained and stirred. Since a liquid containing copper microparticles was separated and settled, the mixture was treated at a centrifugal force of 10000 G for 5 minutes by means of a centrifugal separator to separate completely the liquid, and the supernatant was removed. The operation described above was repeated three times.

The remaining precipitate was recovered in a Kjeldahl flask by using toluene, and then IPA was removed therefrom by means of a rotary evaporator to obtain a black dispersion. The above dispersion was filtrated through a filter of 0.2 μm. It was observed by means of STEM according to the method described above, and as a result thereof, copper microparticles having an average primary particle diameter of 8 nm could be confirmed.

Production Example 2A (Metal Microparticle Dispersion)

A silver microparticle dispersion was prepared in the same manner as in Production Example 1A, except that 5 g of silver (manufactured by Ishifuku Metal Industry Co., Ltd.) was used in place of copper used in Production Example 1A. The above dispersion was filtrated through a filter of 0.2 μm and observed by means of STEM in the same manner as in Production Example 1A, and as a result thereof, silver microparticles having an average primary particle diameter of 10 nm could be confirmed.

Production Example 3A (Metal Microparticle Dispersion)

A copper microparticle dispersion was prepared in the same manner as in Production Example 1A, except that in Production Example 1A, Solsperse 71000 (principal chain: polyethyleneimine skeleton, side chain: having 15 polypropylene glycol units on an average and 2 ethylene glycol units on an average in four side chains, manufactured by Lubrizol Corporation) was used as the polymeric dispersant in place of Solsperse 39000. The above dispersion was filtrated through a filter of 0.2 μm and observed by means of STEM in the same manner as in Production Example 1A, and as a result thereof, copper microparticles having an average primary particle diameter of 8 nm could be confirmed.

Production Example 4A (Metal Microparticle Dispersion)

A copper microparticle dispersion was prepared in the same manner as in Production Example 1A, except that in Production Example 1A, Mariarim AAB-0851 (principal chain: maleic anhydride skeleton, side chain: polyether skeleton, manufactured by NOF CORPORATION) was used as the polymeric dispersant in place of Solsperse 39000. The above dispersion was filtrated through a filter of 0.2 μm and observed by means of STEM in the same manner as in Production Example 1A, and as a result thereof, copper microparticles having an average primary particle diameter of 8 nm could be confirmed.

Production Example 5A (Metal Microparticle Dispersion)

A copper microparticle dispersion was prepared in the same manner as in Production Example 1A, except that in Production Example 1A, EFKA 4010 (principal chain: tolylenediisocyanate skeleton, side chain: polyether skeleton (having 2 polyethylene glycol units in three side chains), manufactured by Efka Chemicals B.V.) was used as the polymeric dispersant in place of Solsperse 39000. The above dispersion was filtrated through a filter of 0.2 μm and observed by means of STEM in the same manner as in Production Example 1A, and as a result thereof, copper microparticles having an average primary particle diameter of 8 nm could be confirmed.

Production Comparative Example 1A (Metal Microparticle Dispersion)

A copper microparticle dispersion was prepared in the same manner as in Production Example 1A, except in Production Example 1A, Solsperse 28000 (principal chain: polyethyleneimine skeleton, side chain: having 4 caprolactone units on an average in five side chains, manufactured by Lubrizol Corporation) was used as the polymeric dispersant in place of Solsperse 39000. The above dispersion was filtrated through a filter of 0.2 μm and observed by means of STEM in the same manner as in Production Example 1A, and as a result thereof, copper microparticles having an average primary particle diameter of 8 nm could be confirmed.

Example 1A (Electrically Conductive Substrate)

The copper microparticle dispersion obtained in Production Example 1A was coated on a full flat face side of a polyethylene naphthalate film (PEN) ("Teonex Q65FA", melting point: 270° C., manufactured by DuPont Teijin Films Japan Limited) having a thickness of 200 μm by spin coating. Then, the film was heated at 180° C. for 30 minutes in order to dry the solvent component to remove the organic materials.

Subsequently, the film was subjected to burning treatment by means of a microwave surface wave plasma treating equipment (MSP-1500, manufactured by Micro Denshi Co., Ltd.). Burning by the plasma treatment was carried out at a hydrogen-introducing pressure of 30 Pa and a microwave output of 700 W for 5 minutes using a hydrogen gas to obtain an electrically conductive substrate. Temperature on the substrate surface was measured by a thermocouple to find that it was maintained at 25° C. before the plasma treatment and that it reached 180° C. in finishing irradiation with the plasma.

The electrically conductive substrate thus obtained was evaluated by the methods described above, and the results thereof are shown in Table 1.

Example 2A (Electrically Conductive Substrate)

An electrically conductive substrate was obtained in the same manner as in Example 1A, except that the silver microparticle dispersion obtained in Production Example 2A was used. The electrically conductive substrate thus obtained was evaluated in the same manner as in Example 1A, and the results thereof are shown in Table 1.

Example 3A (Electrically Conductive Substrate)

An electrically conductive substrate was obtained in the same manner as in Example 1A, except that the copper microparticle dispersion obtained in Production Example 3A was used. The electrically conductive substrate thus obtained was evaluated in the same manner as in Example 1A, and the results thereof are shown in Table 1.

Example 4A (Electrically Conductive Substrate)

An electrically conductive substrate was obtained in the same manner as in Example 1A, except that the copper microparticle dispersion obtained in Production Example 4A was used. The electrically conductive substrate thus obtained was evaluated in the same manner as in Example 1A, and the results thereof are shown in Table 1.

Example 5A (Electrically Conductive Substrate)

An electrically conductive substrate was obtained in the same manner as in Example 1A, except the copper microparticle dispersion obtained in Production Example 5A was used. The electrically conductive substrate thus obtained was evaluated in the same manner as in Example 1A, and the results thereof are shown in Table 1.

Comparative Example 1A (Electrically Conductive Substrate)

An electrically conductive substrate was obtained in the same manner as in Example 1A, except that the copper microparticle dispersion obtained in Production Comparative Example 1A was used. The electrically conductive substrate thus obtained was evaluated in the same manner as in Example 1A, and the results thereof are shown in Table 1.

TABLE 1

|  | Example | | |
| --- | --- | --- | --- |
|  | 1A | 2A | 3A |
| Metal | Copper | Silver | Copper |
| Dispersant | Solsperse 39000 | Solsperse 39000 | Solsperse 71000 |
| Electrical conductivity (volume resistivity) (Ω · cm) | $4.4 \times 10^{-5}$ | $9.0 \times 10^{-6}$ | $4.5 \times 10^{-5}$ |
| Film thickness (nm) | 300 | 300 | 300 |
| Sinter depth | Good | Good | Good |

|  | Example | | Comparative Example |
| --- | --- | --- | --- |
|  | 4A | 5A | 1A |
| Metal | Copper | Copper | Copper |
| Dispersant | Mariarim AAB-0851 | EFKA 4010 | Solsperse 28000 |

TABLE 1-continued

| Electrical conductivity (volume resistivity) ($\Omega \cdot$ cm) | $2.2 \times 10^{-5}$ | $4.1 \times 10^{-5}$ | $5.7 \times 10^{-4}$ |
|---|---|---|---|
| Film thickness (nm) | 300 | 300 | 400 |
| Sinter depth | Good | Good | Inferior |

Example 6A (Electrically Conductive Substrate)

An electrically conductive substrate was obtained in the same manner as in Example 1A, except that in Example 1A, the heat treatment (heating at 180° C. for 30 minutes) for removing the organic materials was not carried out and that the burning time by the plasma treatment was changed to 10 minutes. Temperature on the substrate surface was measured by a thermocouple to find that it was maintained, as was the case with Example 1A, at 25° C. before the plasma treatment and that it reached 180° C. after finishing irradiation with the plasma. The electrically conductive substrate thus obtained was evaluated in the same manners as in Example 1A, and the results thereof are shown in Table 2.

Example 7A (Electrically Conductive Substrate)

An electrically conductive substrate was obtained in the same manner as in Example 6A, except that in Example 6A, the dispersion obtained in Production Example 2A was used. The electrically conductive substrate thus obtained was evaluated in the same manners as in Example 1A, and the results thereof are shown in Table 2.

Example 8A (Electrically Conductive Substrate)

An electrically conductive substrate was obtained in the same manner as in Example 6A, except that in Example 6A, the dispersion obtained in production Example 3A was used. The electrically conductive substrate thus obtained was evaluated in the same manner as in Example 1A, and the results thereof are shown in Table 2.

Example 9A (Electrically Conductive Substrate)

An electrically conductive substrate was obtained in the same manner as in Example 6A, except that in Example 6A, the dispersion obtained in Production Example 4A was used. The electrically conductive substrate thus obtained was evaluated in the same manners as in Example 1A, and the results thereof are shown in Table 2.

Example 10A (Electrically Conductive Substrate)

An electrically conductive substrate was obtained in the same manner as in Example 6A, except that in Example 6A, the dispersion obtained in Production Example 5A was used. The electrically conductive substrate thus obtained was evaluated in the same manners as in Example 1A, and the results thereof are shown in Table 2.

Comparative Example 2A (Electrically Conductive Substrate)

An electrically conductive substrate was obtained in the same manner as in Example 6A, except that in Example 6A, the dispersion obtained in Production Comparative Example 1A was used. The electrically conductive substrate thus obtained was evaluated in the same manner as in Example 1A, and the results thereof are shown in Table 2.

TABLE 2

| | Example | | |
|---|---|---|---|
| | 6A | 7A | 8A |
| Metal | Copper | Copper | Copper |
| Dispersant | Solsperse 39000 | Solsperse 39000 | Solsperse 71000 |
| Electrical conductivity (volume resistivity) ($\Omega \cdot$ cm) | $5.0 \times 10^{-5}$ | $8.0 \times 10^{-6}$ | $9.8 \times 10^{-6}$ |
| Film thickness (nm) | 300 | 300 | 300 |
| Sinter depth | Good | Good | Good |

| | Example | | Comparative Example |
|---|---|---|---|
| | 9A | 10A | 2A |
| Metal | Copper | Copper | Copper |
| Dispersant | Mariarim AAB-0851 | EFKA 4010 | Solsperse 28000 |
| Electrical conductivity (volume resistivity) ($\Omega \cdot$ cm) | $3.2 \times 10^{-5}$ | $4.7 \times 10^{-5}$ | $2.4 \times 10^{-4}$ |
| Film thickness (nm) | 300 | 300 | 450 |
| Sinter depth | Good | Good | Inferior |

Production Example 1B (Copper Microparticles)

Cupric oxide 64 g and gelatin 5.1 g as a protective colloid were added to 650 ml of water and mixed, and the mixed solution was adjusted to a pH of 10 by using aqueous ammonia of 15%. Then, the temperature was elevated from room temperature up to 90° C. in 20 minutes. After elevating the temperature, a solution prepared by mixing 6.4 g of a mercaptoacetic acid solution of 1% as a complexing agent and 75 g of hydrazine monohydrate of 80% with 150 mL of purified water was added thereto while stirring, and they were reacted with cupric oxide in 1 hour to obtain copper microparticles. The filtrate was washed and dried to obtain the copper microparticles. The copper microparticles thus obtained were observed by means of STEM according to the method described above to result in finding that an average primary particle diameter thereof was 0.05 μm.

Production Example 1B (Copper Microparticle Dispersion)

A mayonnaise bottle of 225 mL was charged with 3 g of Solsperse 41000 (principal chain: polyether skeleton, manufactured by Lubrizol Corporation) as a dispersant and 67 g of toluene, and the mixture was stirred.

After dissolved, 30 g of the copper microparticles obtained in Production Example 1B were added thereto and stirred.

Zirconia beads 200 g having a diameter of 0.3 mm were added thereto, and the bottles was covered with a cap and shaken for 3 hours by means of a paint shaker to thereby obtain a cupreous copper microparticle dispersion.

The above dispersion was filtrated under applying pressure and then observed by means of STEM according to the method described above, and copper microparticles which were not coagulated could be confirmed.

Production Example 2B (Copper Microparticle Dispersion)

A copper microparticle dispersion was obtained in the same manner as in Production Example 1B, except that the dispersant was changed to Solsperse 71000 (principal chain: polyethyleneimine skeleton, side chain: polyether skeleton, side chain number: 4 chains, having 15 polypropylene glycol units on an average and 2 ethylene glycol units on an average, manufactured by Lubrizol Corporation). The above dispersion was filtrated under applying pressure and then observed by means of STEM according to the method described above, and copper microparticles which were not coagulated could be confirmed.

Production Example 3B (Copper Microparticle Dispersion)

A copper microparticle dispersion was obtained in the same manner as in Production Example 1B, except that the dispersant was changed to Solsperse 39000 (principal chain: polyethyleneimine skeleton, side chain: polyester skeleton, side chain number: 3 chains, having 6 valerolactone derivative units on an average and 6 caprolactone derivative units on an average, manufactured by Lubrizol Corporation). The above dispersion was filtrated under applying pressure and then observed by means of STEM according to the method described above, and copper microparticles which were not coagulated could be confirmed.

Production Example 4B (Copper Microparticle Dispersion)

A copper microparticle dispersion was obtained in the same manner as in Production Example 1B, except that the dispersant was changed to Ajisper PB-821 (principal chain: polyacrylamine skeleton, side chain: polyester skeleton, side chain number: 3 chains, having 16 caprolactone derivative units on an average, manufactured by Ajinomoto Co., Inc.). The above dispersion was filtrated under applying pressure and then observed by means of STEM according to the method described above, and copper microparticles which were not coagulated could be confirmed.

Production Example 5B (Copper Microparticle Dispersion)

A copper microparticle dispersion was obtained in the same manner as in Production Example 1B, except that the dispersant was changed to Mariarim AAB-0851 (principal chain: maleic anhydride skeleton, side chain: polyether skeleton (propylene glycol unit), manufactured by NOF CORPORATION). The above dispersion was filtrated under applying pressure and then observed by means of STEM according to the method described above, and copper microparticles which were not coagulated could be confirmed.

Production Example 6B (Copper Microparticle Dispersion)

A copper microparticle dispersion was obtained in the same manner as in Production Example 1B, except that the dispersant was changed to EFKA 4010 (principal chain: tolylenediisocyanate skeleton, side chain: polyether skeleton, having 2 polyethylene glycol units in three side chains and 3 caprolactone units in one side chain, manufactured by Efka Chemicals B.V.). The above dispersion was filtrated under applying pressure and then observed by means of STEM according to the method described above, and copper microparticles which were not coagulated could be confirmed.

Production Example 7B (Copper Microparticle Dispersion)

A mayonnaise bottle of 225 mL was charged with 4.7 g of Solsperse 39000 (described above, manufactured by Lubrizol Corporation) and 48.3 g of propylene glycol monomethyl ether acetate (PGMEA), and the mixture was stirred. After dissolved, 47 g of the copper microparticles produced in Production Example 1B were added thereto and stirred. Then, the same operation as in Production Example 1B was carried out to obtain a cupreous copper microparticle dispersion. The above dispersion was filtrated under applying pressure and then observed by means of STEM according to the method described above, and copper microparticles which were not coagulated could be confirmed.

The above dispersion had a viscosity of 10 mPa·s and a surface tension of 26.8 mN/m. An ink jet printing aptitude of the above dispersion was evaluated by confirming an ink discharge performance thereof by the method described above to result in finding that discharge curving and clogging were not observed and that the ink jet patterning aptitude was good.

Production Example 8B (Copper Microparticle Dispersion)

A copper microparticle dispersion was obtained in the same manner as in Production Example 7B, except that the solvent was changed to butyl diglycol acetate. The above dispersion was filtrated under applying pressure and then observed by means of STEM according to the method described above, and copper microparticles which were not coagulated could be confirmed.

The above dispersion had a viscosity of 12 mPa·s and a surface tension of 28.3 mN/m. An ink jet printing aptitude of the above dispersion was evaluated by confirming an ink discharge performance thereof by the method described above to result in finding that discharge curving and clogging were not observed and that the ink jet patterning aptitude was good.

Production Example 9B (Copper Microparticle Dispersion)

A copper microparticle dispersion was obtained in the same manner as in Production Example 7B, except that the dispersant was changed to Solsperse 71000 (described above, manufactured by Lubrizol Corporation). The above dispersion was filtrated under applying pressure and then observed by means of STEM according to the method described above, and copper microparticles which were not coagulated could be confirmed.

The above dispersion had a viscosity of 12 mPa·s and a surface tension of 26.9 mN/m. An ink jet printing aptitude of the above dispersion was evaluated by confirming an ink discharge performance thereof by the method described above to result in finding that discharge curving and clogging were not observed and that the ink jet patterning aptitude was good.

Production Example 10B (Copper Microparticle Dispersion)

A mayonnaise bottle of 140 mL was charged with 0.9 g of Solsperse 71000 (described above, manufactured by Lubrizol Corporation) and 41.1 g of toluene, and the mixture was stirred. After dissolved, 18 g of the copper microparticles produced in Production Example 1B were added thereto and stirred. Then, the same operation as in Production Example 1B was carried out to obtain a browned copper microparticle dispersion. The above dispersion was filtrated under applying pressure and then observed by means of STEM according to the method described above, and copper microparticles which were not coagulated could be confirmed.

The above dispersion had a solid matter concentration of 31.7% by mass, a viscosity of 1.6 mPa·s and a surface tension of 22.5 mN/m. An ink jet printing aptitude of the above dispersion was evaluated by confirming an ink discharge performance thereof by the method described above to result in finding that discharge curving and clogging were not observed and that the ink jet patterning aptitude was good.

Production Example 11B (Copper Microparticle Dispersion)

A copper microparticle dispersion was obtained in the same manner as in Production Example 10B, except that the dispersant was changed to Solsperse 8200 (principal chain: polyamide skeleton, containing polypropylene glycol units in a side chain, comb type structure containing a basic functional group, manufactured by Lubrizol Corporation). The above dispersion was filtrated under applying pressure and then observed by means of STEM according to the method described above, and copper microparticles which were not coagulated could be confirmed.

The above dispersion had a solid matter concentration of 30.9% by mass, a viscosity of 1.5 mPa·s and a surface tension of 23.4 mN/m.

Production Example 12B (Copper Microparticle Dispersion)

A copper microparticle dispersion was obtained in the same manner as in Production Example 10B, except that the dispersant was changed to Disperbyk-9076 (principal chain: polyamine skeleton, containing polyether units in a side chain, highly branched structure containing a basic functional group, manufactured by BYK Chemie A.G.). The above dispersion was filtrated under applying pressure and then observed by means of STEM according to the method described above, and copper microparticles which were not coagulated could be confirmed.

The above dispersion had a solid matter concentration of 32.7% by mass, a viscosity of 1.2 mPa·s and a surface tension of 23.2 mN/m.

Production Example 13B (Copper Microparticle Dispersion)

A copper microparticle dispersion was obtained in the same manner as in Production Example 10B, except that the dispersant was changed to Disperbyk-145 (principal chain: polyamine skeleton, containing polyether units in a side chain, highly branched structure containing a basic functional group, manufactured by BYK Chemie A.G.). The above dispersion was filtrated under applying pressure and then observed by means of STEM according to the method described above, and copper microparticles which were not coagulated could be confirmed.

The above dispersion had a solid matter concentration of 31.2% by mass, a viscosity of 1.2 mPa·s and a surface tension of 22.7 mN/m.

Production Example 14B (Copper Microparticle Dispersion)

A copper microparticle dispersion was obtained in the same manner as in Production Example 10B, except that the solvent was changed from toluene to BCA (butylcarbitol acetate). The above dispersion was filtrated under applying pressure and then observed by means of STEM according to the method described above, and copper microparticles which were not coagulated could be confirmed.

The above dispersion had a solid matter concentration of 31.1% by mass, a viscosity of 8.3 mPa·s and a surface tension of 31.5 mN/m. An ink jet printing aptitude of the above dispersion was confirmed by the method described above to result in finding that nozzle clogging and discharge curving were not observed and that the ink jet patterning property was good.

Production Example 15B

A copper microparticle dispersion was obtained in the same manner as in Production Example 10B, except that an amount of Solsperse 71000 (described above, manufactured by Lubrizol Corporation) was changed to 1.8 g; an amount of the copper microparticles was changed to 24 g; and the solvent was changed to 34.2 g of butyl propylene glycol.

The above dispersion had a solid matter concentration of 42.4% by mass, a viscosity of 11.1 mPa·s and a surface tension of 31.2 mN/m. An ink jet printing aptitude of the above dispersion was confirmed by the method described above to result in finding that nozzle clogging and discharge curving were not observed and that the ink jet patterning property was good.

Production Example 16B

A copper microparticle dispersion was obtained in the same manner as in Production Example 10B, except that an amount of Solsperse 71000 (described above, manufactured by Lubrizol Corporation) was changed to 1.2 g; an amount of the copper microparticles was changed to 30 g; and the solvent was changed to 28.8 g of methyl ethyl diglycol.

The above dispersion had a solid matter concentration of 50.9% by mass, a viscosity of 13.1 mPa·s and a surface tension of 30.9 mN/m. An ink jet printing aptitude of the above dispersion was confirmed by the method described above to result in finding that nozzle clogging and discharge curving were not observed and that the ink jet patterning property was good.

Production Example 17B

A copper microparticle dispersion was obtained in the same manner as in Production Example 10B, except that the dispersant was changed from Solsperse 71000 to 1.89 g of Disperbyk-145 (described above, manufactured by BYK Chemie A.G.); an amount of the copper microparticles was changed to 30 g; and the solvent was changed from toluene to 28.1 g of methyl ethyl diglycol.

The above dispersion had a solid matter concentration of 50.7% by mass, a viscosity of 6.84 mPa·s and a surface tension of 28.4 mN/m. An ink jet printing aptitude of the above dispersion was confirmed by the method described above to result in finding that nozzle clogging and discharge curving were not observed and that the ink jet patterning property was good.

Example 1B (Electrically Conductive Substrate)

The copper microparticle dispersion obtained in Production Example 1B was controlled by toluene so that a solid content thereof was 30% by mass, and the dispersion was coated on a full flat face side of a polyethylene naphthalate film (PEN) ("Teonex Q65FA", melting point: 270° C., manufactured by DuPont Teijin Films Japan Limited) having a thickness of 200 μm by spin coating. Then, the film was heated at 160° C. for 30 minutes in order to dry the solvent component to remove the organic materials.

Subsequently, the film was subjected to burning treatment by means of a microwave surface wave plasma treating equipment (MSP-1500, manufactured by Micro Denshi Co., Ltd.). Burning by the plasma treatment was carried out at a hydrogen-introducing pressure of 30 Pa and a microwave output of 600 W for 5 minutes using a hydrogen gas to obtain an electrically conductive substrate. Temperature on the substrate surface was measured by a thermocouple to find that it was maintained at 25° C. before the plasma treatment and that it reached 160° C. in finishing irradiation with the plasma. The substrate thus obtained was not deformed.

The electrically conductive substrate obtained was evaluated by the methods described above, and the results thereof are shown in Table 3.

Example 2B (Electrically Conductive Substrate)

An electrically conductive substrate was obtained in the same manner as in Example 1B, except that the dispersion obtained in Production Example 2B was used. The substrate thus obtained was not deformed.

The electrically conductive substrate obtained was evaluated by the methods described above, and the results thereof are shown in Table 3.

Example 3B (Electrically Conductive Substrate)

The dispersion obtained in Production Example 3B was controlled by toluene so that a solid content thereof was 30% by mass, and the dispersion was coated on a full flat face side of the polyethylene naphthalate film (PEN) ("Teonex Q65FA", melting point: 270° C., manufactured by DuPont Teijin Films Japan Limited) having a thickness of 200 μm by spin coating. Heating for removing the organic materials was not carried out.

Subsequently, the film was subjected to burning treatment by means of the microwave surface wave plasma treating equipment (MSP-1500, manufactured by Micro Denshi Co., Ltd.). Burning by the plasma treatment was carried out at a hydrogen-introducing pressure of 30 Pa and a microwave output of 600 W for 10 minutes using a hydrogen gas to obtain an electrically conductive substrate. Temperature on the substrate surface was measured by a thermocouple to find that it was maintained at 25° C. before the plasma treatment and that it reached 160° C. in finishing irradiation with the plasma. The substrate thus obtained was not deformed.

The electrically conductive substrate obtained was evaluated by the methods described above, and the results thereof are shown in Table 3.

Example 4B (Electrically Conductive Substrate)

An electrically conductive substrate was obtained in the same manner as in Example 3B, except that the dispersant obtained in Production Example 4B was used. The substrate thus obtained was not deformed.

The electrically conductive substrate obtained was evaluated by the methods described above, and the results thereof are shown in Table 3.

Example 5B (Electrically Conductive Substrate)

An electrically conductive substrate was obtained in the same manner as in Example 3B, except that the dispersant obtained in Production Example 1B was used. The substrate thus obtained was not deformed.

The electrically conductive substrate obtained was evaluated by the methods described above, and the results thereof are shown in Table 3.

Example 6B (Electrically Conductive Substrate)

An electrically conductive substrate was obtained in the same manner as in Example 3B, except that the dispersant obtained in Production Example 2B was used. The substrate thus obtained was not deformed.

The electrically conductive substrate obtained was evaluated by the methods described above, and the results thereof are shown in Table 3.

Example 7B (Electrically Conductive Substrate)

An electrically conductive substrate was obtained in the same manner as in Example 3B, except that the dispersant obtained in Production Example 6B was used. The substrate thus obtained was not deformed.

The electrically conductive substrate obtained was evaluated by the methods described above, and the results thereof are shown in Table 3.

Example 8B (Electrically Conductive Substrate)

An electrically conductive substrate was obtained in the same manner as in Example 3B, except that the dispersant obtained in Production Example 7B was used. The substrate thus obtained was not deformed.

The electrically conductive substrate obtained was evaluated by the methods described above, and the results thereof are shown in Table 3.

Example 9B (Electrically Conductive Substrate)

An electrically conductive substrate was obtained in the same manner as in Example 1B, except that the plasma treating condition was changed to a microwave output of 650 W. Temperature on the substrate surface was measured by a thermocouple to find that it was maintained at 25° C. before the plasma treatment and that it reached 180° C. in finishing irradiation with the plasma. The substrate thus obtained was not deformed.

The electrically conductive substrate obtained was evaluated by the methods described above, and the results thereof are shown in Table 3.

Example 10B (Electrically Conductive Substrate)

An electrically conductive substrate was obtained in the same manner as in Example 2B, except that the plasma treating condition was changed to a microwave output of 650 W. The substrate thus obtained was not deformed.

The electrically conductive substrate obtained was evaluated by the methods described above, and the results thereof are shown in Table 3.

Example 11B (Electrically Conductive Substrate)

The dispersion obtained in Production Example 10B was controlled by toluene so that a solid content was 30% by mass and, and the dispersion was coated on a full flat face side of the polyethylene naphthalate film (PEN) ("Teonex Q65FA", melting point: 270° C., manufactured by DuPont Teijin Films Japan Limited) having a thickness of 200 μm by spin coating. Then, the film was heated at 160° C. for 30 minutes in the air in order to remove the organic materials.

Subsequently, the film was subjected to burning treatment by means of the microwave surface wave plasma treating equipment (MSP-1500, manufactured by Micro Denshi Co., Ltd.). Burning by the plasma treatment was carried out at a hydrogen-introducing pressure of 30 Pa and a microwave output of 500 W for 5 minutes using a hydrogen gas to obtain an electrically conductive substrate. Temperature on the substrate surface was measured by a thermocouple to find that it was maintained at 25° C. before the plasma treatment and that it reached 160° C. in finishing irradiation with the plasma. The substrate thus obtained was not deformed.

The electrically conductive substrate obtained was evaluated by the methods described above, and the results thereof are shown in Table 4.

Example 12B (Electrically Conductive Substrate)

An electrically conductive substrate was obtained in the same manner as in Example 11B, except that the dispersion obtained in Production Example 11B was used. The substrate thus obtained was not deformed.

The electrically conductive substrate obtained was evaluated by the methods described above, and the results thereof are shown in Table 4.

Example 13B (Electrically Conductive Substrate)

An electrically conductive substrate was obtained in the same manner as in Example 11B, except that the dispersion obtained in Production Example 12B was used. The substrate thus obtained was not deformed.

The electrically conductive substrate obtained was evaluated by the methods described above, and the results thereof are shown in Table 4.

Example 14B (Electrically Conductive Substrate)

An electrically conductive substrate was obtained in the same manner as in Example 11B, except that the dispersion obtained in Production Example 13B was used. The substrate thus obtained was not deformed.

The electrically conductive substrate obtained was evaluated by the methods described above, and the results thereof are shown in Table 4.

Comparative Example 1B

An electrically conductive substrate was obtained in the same manner as in Example 3B, except that the dispersant was changed to Solsperse 16000 (principal chain: polyethyleneimine skeleton, side chain: 12-hydroxystearic ester, manufactured by Lubrizol Corporation). The electrically conductive substrate thus obtained was evaluated by the methods described above, and the results thereof are shown in Table 3. The substrate thus obtained was not deformed, but a surface resistance of the electrically conductive substrate was as high as $10^8 \Omega/\square$ or more and could not be measured. It is considered to be attributable to that organic materials originating in the dispersant were not decomposed by the microwave surface wave plasma and remained.

Comparative Example 2B

An electrically conductive substrate was obtained in the same manner as in Example 7B, except that the dispersant was changed to oleylamine. The above dispersion was filtrated under applying pressure but could not be filtrated. Further, it was observed by means of STEM to find that coagulated matters were present in a large amount, and ink jet printing was tried, but the ink could not be discharged.

Comparative Example 3B

An electrically conductive substrate was tried to be produced in the same manner as in Example 7B, except that the dispersant was changed to Colorburst 2176 (succinic anhydride, manufactured by Lubrizol Corporation), but the solution was immediately coagulated and settled to make it impossible to obtain a dispersion.

Comparative Example 4B

An electrically conductive substrate was obtained in the same manner as in Example 7B, except that the dispersant was changed to Disperbyk-116 (acryl dispersant comprising butyl acrylate and butyl methacrylate, manufactured by BYK Chemie A.G.). The above dispersion was filtrated under applying pressure but could not be filtrated. Further, it was observed by means of STEM to find that coagulated matters were present in a large amount, and ink jet printing was tried, but the ink could not be discharged.

TABLE 3

| | Example | | | |
|---|---|---|---|---|
| | 1B | 2B | 3B | 4B |
| Dispersant | Solsperse 41000 | Solsperse 71000 | Solsperse 39000 | Ajisper PB-821 |
| Electrical conductivity (volume resistivity) ($\Omega \cdot cm$) | $2.40 \times 10^{-5}$ | $2.04 \times 10^{-5}$ | $2.37 \times 10^{-5}$ | $3.06 \times 10^{-5}$ |
| Film thickness (nm) | 400 | 400 | 400 | 400 |
| Sinter depth | Good | Good | Good | Good |

| | Example | | | |
|---|---|---|---|---|
| | 5B | 6B | 7B | 8B |
| Dispersant | Solsperse 41000 | Solsperse 71000 | Mariarim AAB-0851 | EFKA 4010 |
| Electrical conductivity (volume resistivity) ($\Omega \cdot cm$) | $1.05 \times 10^{-5}$ | $1.29 \times 10^{-5}$ | $1.24 \times 10^{-5}$ | $2.32 \times 10^{-5}$ |

TABLE 3-continued

| | | | | |
|---|---|---|---|---|
| Film thickness (nm) | 300 | 300 | 300 | 300 |
| Sinter depth | Good | Good | Good | Good |

| | Example | | Comparative Example |
|---|---|---|---|
| | 9B | 10B | 1B |
| Dispersant | Solsperse 41000 | Solsperse 71000 | Solsperse 16000 |
| Electrical conductivity (volume resistivity) (Ω · cm) | $1.50 \times 10^{-5}$ | $1.11 \times 10^{-5}$ | >1000 |
| Film thickness (nm) | 300 | 300 | 440 |
| Sinter depth | Good | Good | Inferior |

TABLE 4

| | Example | | | |
|---|---|---|---|---|
| | 11B | 12B | 13B | 14B |
| Dispersant | Solsperse 71000 | Solsperse 8200 | Disperbyk-9076 | Disperbyk-145 |
| Electrical conductivity (volume resistivity) (Ω · cm) | $7.36 \times 10^{-6}$ | $1.39 \times 10^{-5}$ | $8.58 \times 10^{-6}$ | $1.19 \times 10^{-5}$ |
| Film thickness (nm) | 300 | 300 | 300 | 300 |
| Sinter depth | Good | Good | Good | Good |

INDUSTRIAL APPLICABILITY

An electrically conductive substrate produced by using the metal microparticle dispersion of the present invention has a high adhesive property between a base material and a metal microparticle sintered film, and it is excellent in an electrical conductivity. Accordingly, the above electrically conductive substrate can suitably be used for printed wiring boards, multilayer printed wiring boards, flexible printed wiring boards, electromagnetic shields and the like. Also, in the production process of the present invention, a circuit pattern can be formed directly on a base material by a printing method, and therefore the production efficiency is high as compared with an etching method. Further, the dispersant for metal microparticles is easily decomposable to make it possible to simplify a burning step. Accordingly, the production cost can be reduced, and the production efficiency is very high.

What is claimed is:

1. A metal microparticle dispersion comprising metal microparticles, a polymeric dispersant and a dispersion medium,
    wherein an average primary particle diameter of the metal microparticles is 0.001 to 0.5 µm;
    the polymeric dispersant comprises a principal chain and a side chain;
    the polymeric dispersant further comprises a polyether skeleton in the principal chain;
    a content of the above polymeric dispersant is 0.1 to 100 parts by mass based on a content of 100 parts by mass of the metal microparticles; and
    wherein the polymeric dispersant is represented by the following Formula (III)

$$R^4O\text{---}(R^5O)_n\text{---}H \quad (III)$$

wherein $R^4$ is a phosphoric acid group and $R^5$ is a linear or branched alkylene group having 2 to 4 carbon atoms, and n represents a number from 1 to 30.

2. The metal microparticle dispersion according to claim 1, wherein the polyether skeleton comprises at least one polyethylene glycol and at least one polypropylene glycol as a constitutional unit.

3. A production process for an electrically conductive substrate, comprising printing a coating solution containing the metal microparticle dispersion according to claim 1 in a pattern-like form on a base material to form a printed layer and subjecting the above printed layer to burning treatment to form a pattern-like metal microparticle sintered film.

4. The production process for an electrically conductive substrate according to claim 3, wherein the burning is carried out by a surface wave plasma generated by applying a microwave energy.

5. The production process for an electrically conductive substrate according to claim 4, wherein the burning is carried out by a surface wave plasma generated under inert gas atmosphere and/or reducing gas atmosphere.

6. The production process for an electrically conductive substrate according to claim 3, wherein the burning comprises (i) a step in which burning is carried out at 165° C. or lower under atmosphere containing oxygen and (ii) a step in which burning is carried out at 165° C. or lower by a surface wave plasma under inert gas atmosphere and/or reducing gas atmosphere.

7. An electrically conductive substrate produced by the production process according to claim 3.

8. The metal microparticle dispersion according to claim 1, wherein metal constituting the metal microparticle dispersion is at least one selected from the group consisting of gold, silver, copper, nickel, platinum, palladium, tin, iron, chromium, indium, silicon and germanium.

9. The metal microparticle dispersion according to claim 1, wherein the dispersion medium is at least one selected from the group consisting of aliphatic hydrocarbons, aromatic hydrocarbons, ketones, esters and alcohols.

10. The metal microparticle dispersion according to claim 2, wherein a sum of the numbers of the polyethylene glycol unit and the polypropylene glycol unit is 10 or more in terms of an average value.

11. The metal microparticle dispersion according to claim 1, wherein the polyether skeleton comprises at least one polyethylene glycol or at least one polypropylene glycol as a constitutional unit.

12. The metal microparticle dispersion according to claim 11, wherein a sum of the numbers of the polyethylene glycol unit or the polypropylene glycol unit is 10 or more in terms of an average value.

\* \* \* \* \*